US012739966B2

(12) United States Patent
Li et al.

(10) Patent No.: US 12,739,966 B2
(45) Date of Patent: Sep. 15, 2026

(54) SHIELDING STRUCTURE AND CIRCUIT BOARD

(71) Applicant: ZTE CORPORATION, Shenzhen (CN)

(72) Inventors: Jinlong Li, Shenzhen (CN); Xin Kang, Shenzhen (CN); Zhongmin Wei, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 280 days.

(21) Appl. No.: 18/569,663

(22) PCT Filed: Mar. 15, 2022

(86) PCT No.: PCT/CN2022/080934
§ 371 (c)(1),
(2) Date: Dec. 13, 2023

(87) PCT Pub. No.: WO2022/262335
PCT Pub. Date: Dec. 22, 2022

(65) Prior Publication Data

US 2024/0276634 A1 Aug. 15, 2024

(30) Foreign Application Priority Data

Jun. 18, 2021 (CN) ........................ 202110678484.5

(51) Int. Cl.
*H05K 1/02* (2006.01)
*H05K 1/11* (2006.01)

(52) U.S. Cl.
CPC .......... *H05K 1/0216* (2013.01); *H05K 1/115* (2013.01); *H05K 2201/0715* (2013.01)

(58) Field of Classification Search
CPC ....... H05K 1/0216; H05K 2201/09618; H05K 1/0222; H05K 2201/0707; H05K 1/0224
See application file for complete search history.

(56) References Cited

U.S. PATENT DOCUMENTS 4,801,905 A * 1/1989 Becker .................... H01P 3/081 174/117 FF
5,436,405 A * 7/1995 Hogge, Jr. ........... H05K 1/0219 174/250

(Continued)

FOREIGN PATENT DOCUMENTS

CN 101527298 A 9/2009
CN 101677487 A 3/2010

(Continued)

OTHER PUBLICATIONS

European Patent Office, extended European Search Report dated Sep. 30, 2024, for corresponding EP application No. 22823826.7.
WIPO, International Search Report issued on May 16, 2022.

*Primary Examiner* — Sherman Ng
(74) *Attorney, Agent, or Firm* — Li & Cai Intellectual Property (USA) Office

(57) ABSTRACT

Embodiments of the present disclosure provide a shielding structure for blocking electromagnetic waves, and a circuit board. The shielding structure includes at least one strip-shaped section disposed at a peripheral area of a connection terminal of a signal line in the circuit board and configured to block the electromagnetic waves with a preset wave-length, and the shielding structure is provided with an outlet for allowing the signal line to be led out.

12 Claims, 6 Drawing Sheets

(56) References Cited

U.S. PATENT DOCUMENTS

| | | | | |
|---|---|---|---|---|
| 9,159,625 | B1 | 10/2015 | Lee | |
| 2012/0112854 | A1* | 5/2012 | Iwaki | H03H 9/725 333/133 |
| 2012/0187550 | A1 | 7/2012 | Wu | |
| 2013/0306363 | A1* | 11/2013 | Yukimasa | H05K 1/0236 174/376 |
| 2013/0330941 | A1 | 12/2013 | Jeon | |
| 2016/0150639 | A1 | 5/2016 | Gailus | |
| 2019/0191540 | A1 | 6/2019 | Boaron | |
| 2021/0392739 | A1* | 12/2021 | Hong | H04M 1/0277 |

FOREIGN PATENT DOCUMENTS

| | | | |
|---|---|---|---|
| CN | 104378912 | A | 2/2015 |
| CN | 106257967 | A | 12/2016 |
| CN | 106449602 | A | 2/2017 |
| JP | H 08250912 | A | 9/1996 |
| KR | 20040096171 | A | 11/2004 |
| KR | 20100000242 | A | 1/2010 |

* cited by examiner

SHIELDING STRUCTURE AND CIRCUIT BOARD

CROSS-REFERENCE TO RELATED APPLICATION

This application is a National Phase Application filed under 35 U.S.C. 371 as a national stage of PCT/CN2022/080934, filed on Mar. 15, 2022, the disclosure of which is hereby incorporated by reference in its entirety.

TECHNICAL FIELD

The present disclosure relates to the technical field of communications.

BACKGROUND

With the advent of the era of big data, in order to satisfy requirements of communication and interaction of the big data, single-channel signal rates of digital chips are continuously increasing, and the higher the rates of signals, the larger the bandwidths of channels needed for transmission of the signals, the higher the design density of Printed Circuit Boards (hereinafter referred to as PCBs) commonly used as the digital chips, the greater the board thicknesses and the quantity of layers. Since all digital signals exist in circuits in a form of a closed loop, the signals after being sent from an output terminal to a receiving terminal through a wire need to return with aid of ground planes of the PCBs.

SUMMARY

In order to solve at least one of the technical problems in the existing technology, embodiments of the present disclosure provide a shielding structure and a circuit board. The shielding structure can effectively block electromagnetic waves, so that signal waves radiated outwards from a connection terminal of a signal line and interference waves radiated from the outside can be effectively blocked, which can reduce return loss generated during signal transmission, and can also improve stability of the signal transmission.

In order to achieve the objective of the present disclosure, a shielding structure of a circuit board for blocking electromagnetic waves is provided. The shielding structure includes at least one strip-shaped section disposed in a peripheral area of a connection terminal of a signal line in the circuit board and configured to block the electromagnetic waves with a preset wavelength, and the shielding structure is provided with an outlet for allowing the signal line to be led out.

According to an embodiment of the present disclosure, the at least one strip-shaped section includes one strip-shaped section disposed in the peripheral area of the connection terminal of the signal line, and the outlet is formed between two ends of the one strip-shaped section.

According to an embodiment of the present disclosure, the one strip-shaped section includes a first shielding via penetrating through the circuit board in a direction perpendicular to the circuit board, and a conductive layer is disposed on a hole wall of the first shielding via and is grounded.

According to an embodiment of the present disclosure, the at least one strip-shaped section includes a plurality of strip-shaped sections, the outlet is formed between two adjacent strip-shaped sections of the plurality of strip-shaped sections, and a gap is provided between at least one pair of strip-shaped sections adjacent to each other among other strip-shaped sections except the two adjacent strip-shaped sections of the plurality of strip-shaped sections, and the gap meets a requirement of blocking the electromagnetic waves with the preset wavelength.

According to an embodiment of the present disclosure, the at least one strip-shaped section includes a plurality of strip-shaped sections, the outlet is formed between two adjacent strip-shaped sections of the plurality of strip-shaped sections, and there is no gap provided between every two adjacent strip-shaped sections among other strip-shaped sections except the two adjacent strip-shaped sections of the plurality of strip-shaped sections.

According to an embodiment of the present disclosure, each of the plurality of strip-shaped sections includes a second shielding via penetrating through the circuit board in a direction perpendicular to the circuit board, and a conductive layer is disposed on an inner wall of the second shielding via and is grounded.

According to an embodiment of the present disclosure, a quantity of the plurality of strip-shaped sections is three, a quantity of second shielding vias is three, the three second shielding vias are all strip-shaped holes, and two shielding vias, which are adjacent to the outlet, of the three second shielding vias are parallel to each other, and are perpendicular to a remaining one of the three second shielding vias.

According to an embodiment of the present disclosure, the shielding structure further includes an auxiliary shielding structure configured to assist the plurality of strip-shaped sections in blocking the electromagnetic waves, the auxiliary shielding structure includes an auxiliary shielding via penetrating through the circuit board in a direction perpendicular to the circuit board, the auxiliary shielding via is disposed on a side of the plurality of strip-shaped sections away from the connection terminal of the signal line, and a conductive layer is disposed in the auxiliary shielding via and is grounded.

According to an embodiment of the present disclosure, at least one the auxiliary shielding via is provided at a position corresponding to each gap.

As another technical solution, the embodiments of the present disclosure further provide a circuit board, including: at least one signal line configured to be electrically connected to a connector; and a shielding structure, which is the shielding structure provided by the above embodiments.

According to an embodiment of the present disclosure, a ground layer of the circuit board is a ground network, and a region where the at least one strip-shaped section is located on a plane parallel to the circuit board corresponds to a position of a network hole of the ground network.

According to an embodiment of the present disclosure, a ground layer of the circuit board is provided with an outlet corresponding to a position of a region where the at least one strip-shaped section is located on a plane parallel to the circuit board.

DETAIL DESCRIPTION OF EMBODIMENTS

In order to enable those of ordinary skill in the art to better understand the technical solutions of the present disclosure, a shielding structure and a circuit board provided by the embodiments of the present disclosure are described in detail below with reference to the drawings.

Unless otherwise defined, the technical terms or the scientific terms used herein should have general meanings as understood by those of ordinary skill in the field to which the present disclosure belongs. The words "first", "second" and the like used herein do not denote any order, quantity, or importance, but are just used to distinguish between different elements. The words "include", "comprise" and the like indicate that an element or object before the words covers the elements or objects or the equivalents thereof listed after the words, rather than excluding other elements or objects. The words "connect", "couple" and the like are not restricted to physical or mechanical connection, but may also indicate electrical connection, whether direct or indirect.

Return loss, also known as reflection loss, is signal reflection caused by an impedance mismatch. Since the impedance mismatch mainly occurs at a connector, a very high return loss is generated when signal transmission is carried out between a module for connecting the connector and the connector in an existing PCB, and especially when transmission of high-frequency signals is carried out by the connector, the return loss becomes higher. Thus, existing PCBs and connector assemblies cannot meet transmission requirements of signals having rates of 112 Gbps and more.

For vias of the connectors of the existing PCBs, due to a limitation of processing capability and a limitation of characteristics of materials of the PCBs, signal waves radiated from the vias of the connectors may possibly fail to return to a ground network through a ground hole, which causes a very high return loss. Taking a high-frequency electric field with a frequency greater than 50 GHz as an example, when an existing connector is adopted, the return loss can reach or even be higher than −5 dB, which results in a fact that measurement bandwidths in the existing technology cannot reach 50 GHz, and are generally about 40 GHz.

Figure 1:
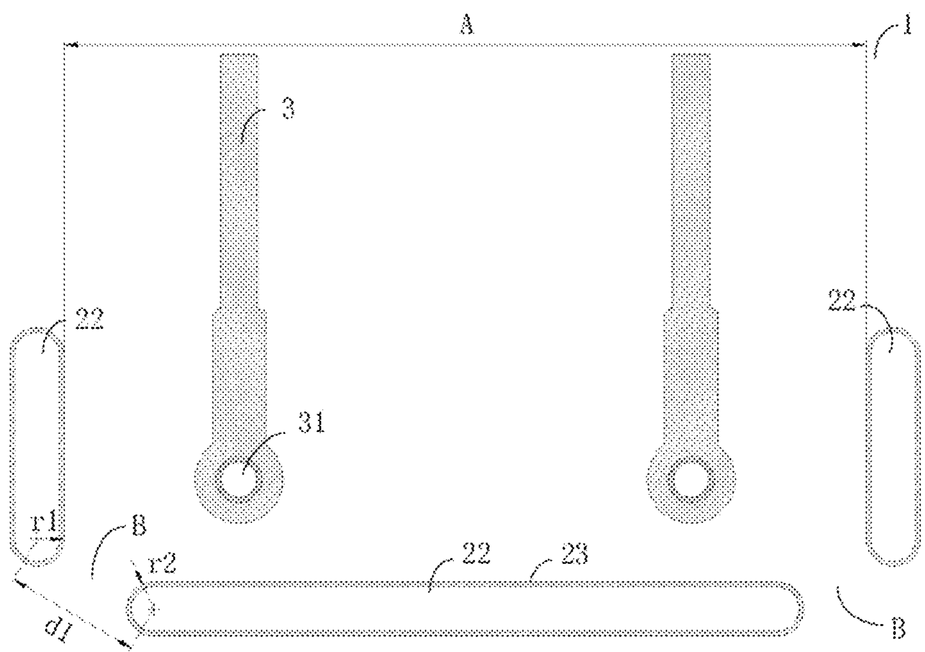
FIG. 1 is a structural diagram of a shielding structure of a circuit board according to an embodiment of the present disclosure.
Figure 2:
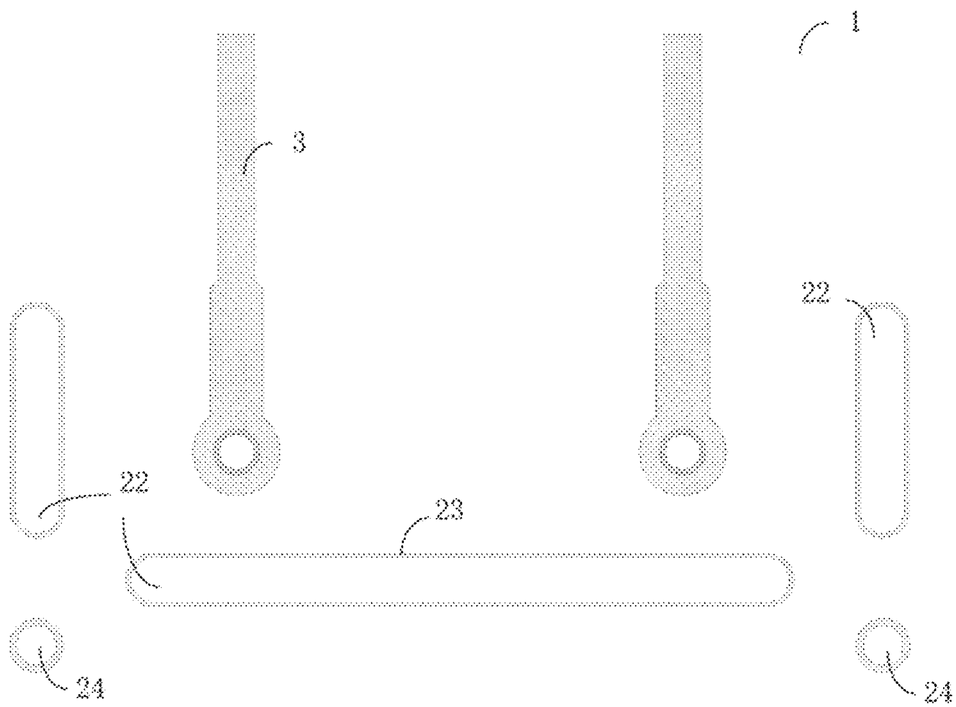
FIG. 2 is a structural diagram of a shielding structure including two auxiliary shielding vias according to an embodiment of the present disclosure.
Figure 3:
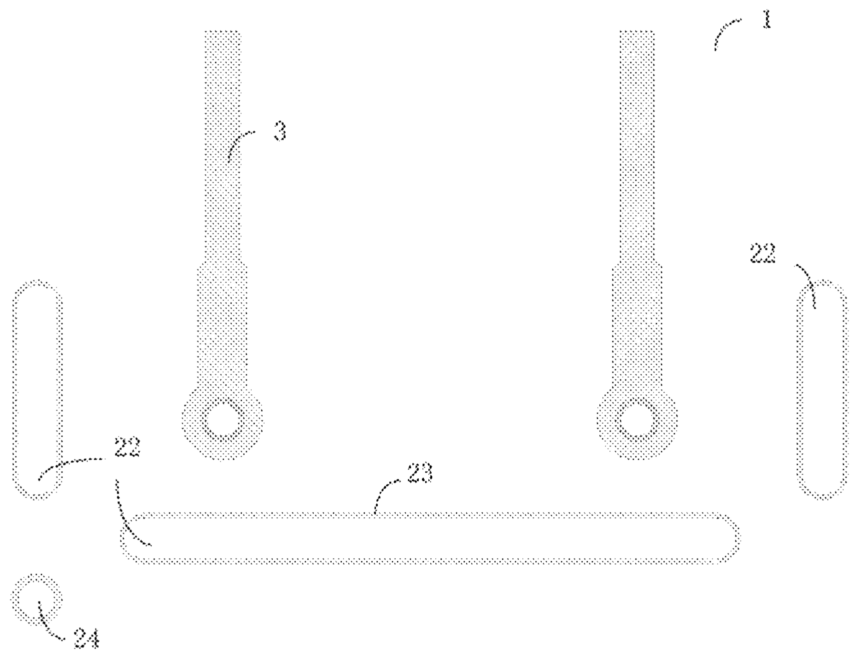
FIG. 3 is a structural diagram of a shielding structure including one auxiliary shielding via according to an embodiment of the present disclosure.
Figure 4:
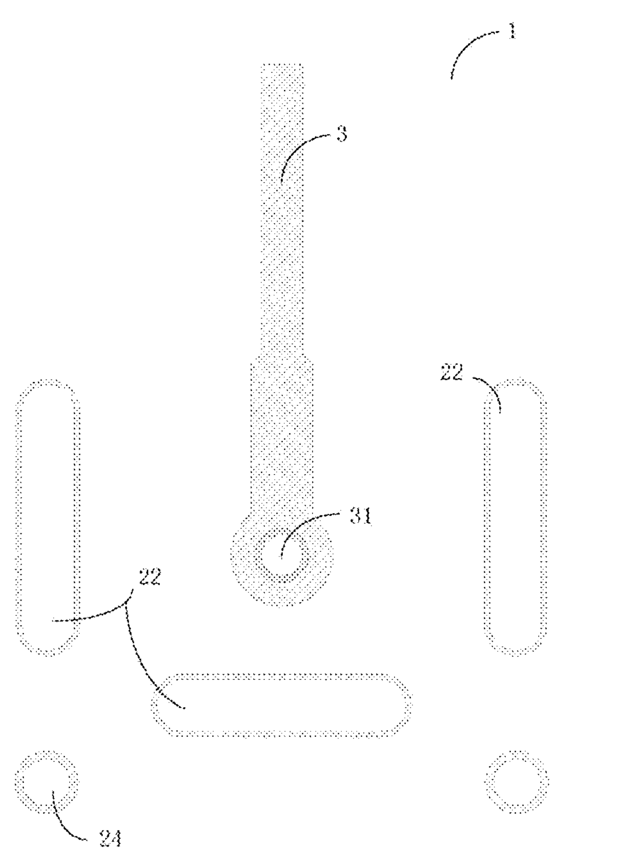
FIG. 4 is a structural diagram of a shielding structure including two auxiliary shielding vias according to another embodiment of the present disclosure.
Figure 5:
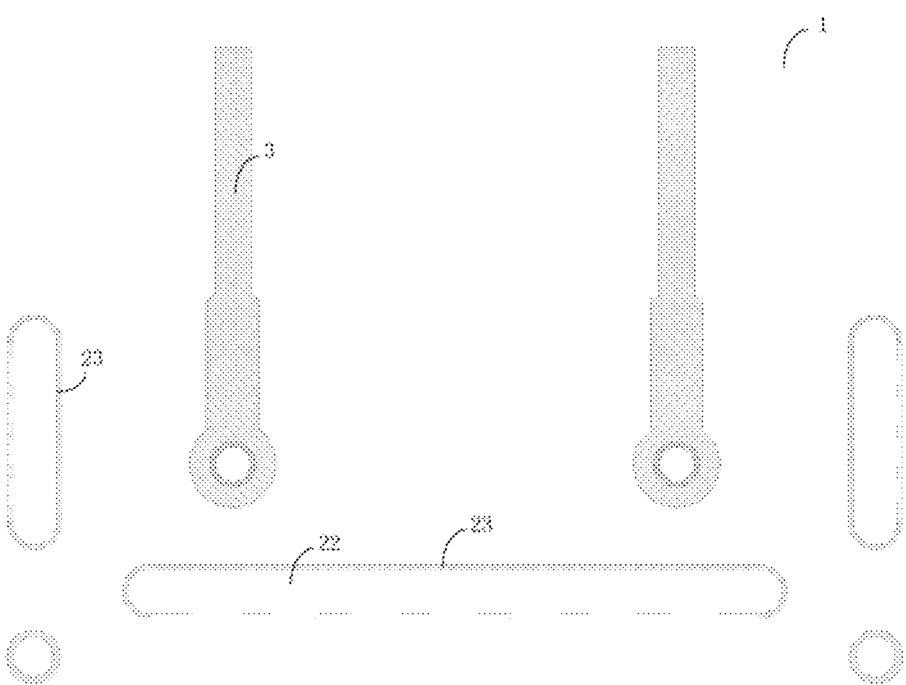
FIG. 5 is a structural diagram of a shielding structure having a conductive layer disposed on part of inner walls of a second shielding via according to an embodiment of the present disclosure.
Figure 6:
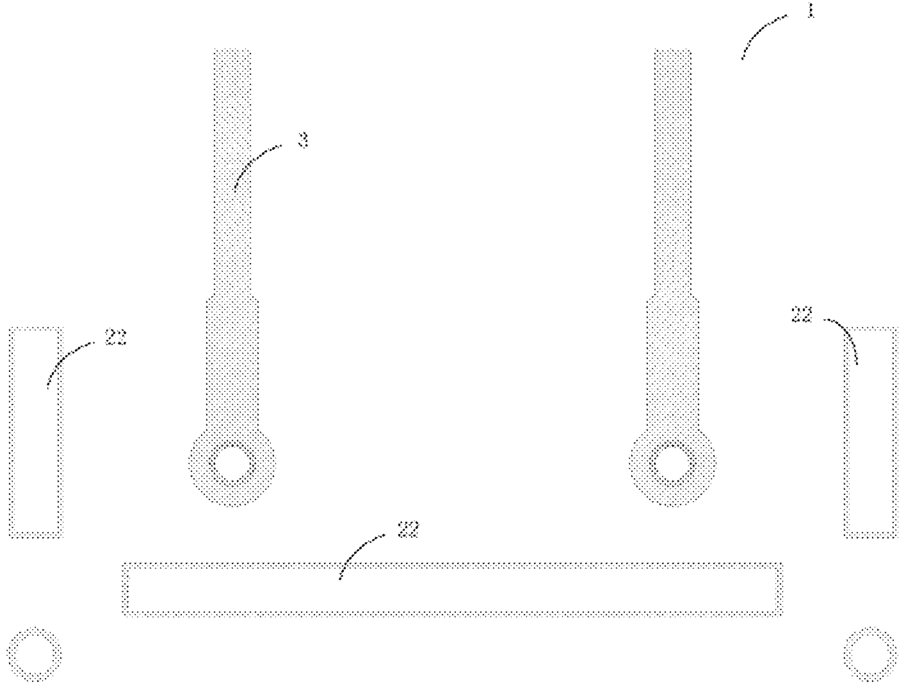
FIG. 6 is a structural diagram of a shielding structure having a second shielding via which has a rectangular cross section according to an embodiment of the present disclosure.
Figure 7:
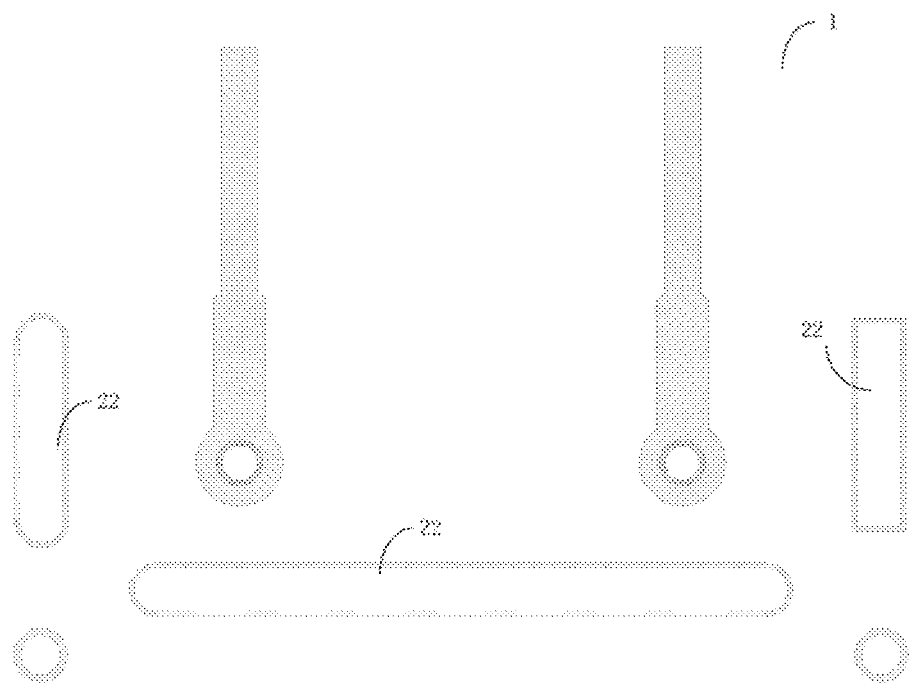
FIG. 7 is a structural diagram of a shielding structure having a plurality of second shielding vias which have cross sections in different shapes according to an embodiment of the present disclosure.

FIG. 1 is a structural diagram of a shielding structure of a circuit board according to an embodiment of the present disclosure, FIG. 2 is a structural diagram of a shielding structure including two auxiliary shielding vias according to an embodiment of the present disclosure, FIG. 3 is a structural diagram of a shielding structure including one auxiliary shielding via according to an embodiment of the present disclosure, FIG. 4 is a structural diagram of a shielding structure including two auxiliary shielding vias according to another embodiment of the present disclosure, FIG. 5 is a structural diagram of a shielding structure having a conductive layer disposed on part of inner walls of a second shielding via according to an embodiment of the present disclosure, FIG. 6 is a structural diagram of a shielding structure having a second shielding via which has a rectangular cross section according to an embodiment of the present disclosure, and FIG. 7 is a structural diagram of a shielding structure having a plurality of second shielding vias which have cross sections in different shapes according to an embodiment of the present disclosure.

Referring to FIG. 1, in order to solve the above technical problem, the present embodiment provides a shielding structure of a circuit board for blocking electromagnetic waves. Specifically, the electromagnetic waves which need to be blocked are, for example, signal waves radiated to outside when a connection terminal of a signal line 3 is electrically connected to a connector and performs signal transmission with the connector, and the signal waves may be generated when the connector transmits signals to the signal line 3 or may be generated when the signal line 3 transmits signals to the connector. The electromagnetic waves which need to be blocked are also, for example, interference waves radiated from the outside to the connection terminal, such as circuit noise. In some embodiments, in order to be capable of being electrically connected to the connector and forming mechanical connection having certain strength with the connector, as shown in FIG. 1, the connection terminal of the signal line 3 may be a signal via 31 filled with a conductor material, so that the connection terminal of the signal line 3 is be easily connected to the connector in a pluggable way.

The shielding structure includes at least one strip-shaped section, which is disposed in a peripheral area of the connection terminal of the signal line 3, and is configured to block electromagnetic waves with a preset wavelength. It should be noted that the at least one strip-shaped section satisfies a requirement of allowing all signal lines 3 to be led out from a space where the strip-shaped section is located.

The term "strip-shaped" refers to a shape having a length to width ratio being greater than 1, and the shape is, for example, an arbitrary segment taken from an elliptical outline, a rectangular outline, or a round outline, or the shape is an arbitrary shape such as an arc shape, a wavy shape, or an irregular shape. Since the strip-shaped section is in a shape of a strip, limitations of characteristics of materials of the circuit board and manufacturing processes can be overcome when the strip-shaped section is manufactured. Compared with, for example, a shielding structure totally formed by a plurality of circular vias, the shielding structure provided by the present embodiment can reduce gaps which exist in the shielding structure as much as possible to effectively block the electromagnetic waves generated when the connection terminal of the signal line 3 and the connector perform the signal transmission, so that return loss can be reduced; and moreover, the shielding structure provided by the present embodiment can block the interference waves (such as the circuit noise) radiated outside a region where it is located, so that the interference waves can be prevented from interfering with the electrical signals transmitted between the connection terminal and the connector, thereby ensuring a stability of the signal transmission between the connection terminal of the signal line 3 and the connector.

In some embodiments, the shielding structure may be electrically connected to a ground plane of a circuit board 1 to guide the signal waves (the electromagnetic waves) radiated outwards when the signal transmission is performed between the connection terminal and the connector into the ground plane of the circuit board 1, so that the shielding structure may cooperate with the ground plane to complete return of the signal waves, thereby reducing the return loss.

In some embodiments, as shown in FIG. 1, the shielding structure includes a plurality of strip-shaped sections, for example, a quantity of the strip-shaped sections may be two, three, four, five, six . . . , but it should be noted that, for not being contrary to the original intention of the embodiments of the present disclosure, the quantity of the strip-shaped sections should be limited by actual process conditions, and should not be too many for reducing slits or gaps existing in the shielding structure. Among the plurality of strip-shaped sections, two adjacent strip-shaped sections have an outlet A defined between ends thereof. Among the rest of the plurality of strip-shaped sections, at least one pair of strip-shaped sections adjacent to each other has a gap provided therebetween, and the gap satisfies a requirement of blocking the electromagnetic waves with the preset wavelength. Taking the shielding structure shown in FIG. 1 as an example, every two adjacent strip-shaped sections among the rest of the plurality of strip-shaped sections have a gap provided therebetween. In practical applications, at least one pair of strip-shaped sections adjacent to each other among a part of the rest of the plurality of strip-shaped sections has a gap provided therebetween, while at least one pair of strip-shaped sections adjacent to each other among the other part of the rest of the plurality of strip-shaped sections has no gap provided therebetween; or, every two adjacent strip-shaped sections among the rest of the plurality of strip-shaped sections has no gap provided therebetween, that is, adjacent ends of every two adjacent strip-shaped sections are connected to each other. Specifically, a quantity of the outlet A may be one, so that line bodies of all the signal lines 3 may be led out through the outlet A, or the quantity of the outlet A may be more than one, so that the line bodies of the signal lines may be respectively led out through the plurality of outlets. Taking the shielding structure shown in FIG. 1 as an example, the shielding structure includes the plurality of strip-shaped sections, the outlet A is formed between two adjacent strip-shaped sections of the plurality of strip-shaped sections, and a gap B is formed between a strip-shaped section deposed opposite to the outlet A and each of the two strip-shaped sections configured to form the outlet A.

In order to enable the gap to meet the requirement of blocking the electromagnetic waves with the preset wavelength, a width of the gap may be adjusted according to wavelengths of the electromagnetic waves to be shielded, for example, the width of each gap is less than or equal to a preset wavelength of the signal waves and the interference waves. Since the signal waves generated during the signal transmission between the signal line 3 and the connector generally have a plurality of different wavelengths, the preset wavelength may be set to be equal to the minimum wavelength of the plurality of different wavelengths, so that most of the signal waves can be blocked, thereby effectively reducing the return loss.

In some embodiments, as shown in FIG. 1, each of the strip-shaped sections includes a second shielding via 22 which penetrates through the circuit board 1 in a direction perpendicular to the circuit board 1 (a thickness direction of the circuit board 1). A conductive layer 23 is disposed on an inner wall of the second shielding via 22 and is grounded. Specifically, the conductive layer 23 may be grounded by being electrically connected to the ground layer of the circuit board 1, so that the signal waves can be guided into the ground layer of the circuit board 1 through the conductive layer 23 after the signal waves are transmitted to the conductive layer 23, and thus complete the return of the signal waves through the ground plane of the circuit board 1, so as to effectively reduce the return loss.

In some embodiments, as shown in FIG. 1, the quantity of the second shielding vias 22 is, for example, three, and all the three second shielding vias 22 are strip-shaped holes. Two second shielding vias 22 adjacent to the outlet A are disposed opposite to each other and parallel to each other, and both are perpendicular to a second shielding via 22 opposite to the outlet A. However, the present embodiment is not limited thereto, and quantity, shape, and arrangement of the second shielding vias 22 may be adjusted according to actual needs. For example, in some other embodiments, the second shielding via 22 is not limited to being the strip-shaped hole, and may include a via having a cross section in an oval shape, a rectangular shape, an arc shape, or a wavy shape. In some embodiments, as shown in FIG. 1, a cross section of each second shielding via 22 is in a shape of a long strip with two semicircular ends, in which case, in order to enable the gap B to meet the requirement of blocking the electromagnetic waves with the preset wavelength, a distance dl between centers of two semicircular ends of two adjacent second shielding vias 22 should be greater than the sum of radii (r1, r2) of the two semicircular ends and less than the sum of the radii (r1, r2) of the two semicircular ends and a preset value, so that the gap between the two adjacent second shielding vias 22 is neither so small to cause difficulty in manufacturing, nor so large to fail to restrict passage of the signal waves or the interference waves. For example, the preset value may be 15 mil. Alternatively, as shown in FIG. 6, the cross-section of the second shielding via 22 may be rectangular. Alternatively, as shown in FIG. 7, the shapes of the cross-sections of a plurality of second shielding vias 22 may be the same or different.

In some embodiments, as shown in FIG. 1, the conductive layer 23 may be disposed on the entire inner wall of the second shielding via 22. However, since a function of the conductive layer 23 is to guide the electromagnetic waves into the ground layer of the circuit board 1 to block the electromagnetic waves, the conductive layer 23 just needs to be capable of blocking the electromagnetic waves in propagation directions of the signal waves and the interference waves, and therefore, the conductive layer 23 does not need to be distributed on the entire inner wall of the second shielding via 22, so as to reduce manufacturing cost. Taking the plurality of second shielding vias 22 shown in FIG. 5 as an example, the conductive layer 23 may be disposed on a portion of the inner wall of the second shielding via 22 on a side close to the signal line 3 and arc-shaped portions of the inner wall at two ends. In addition, the conductive layer 23 may also be disposed on a portion of the inner wall of the second shielding via 22 on a side away from the signal line 3 and arc-shaped portions of the inner wall at the two ends.

In some embodiments, as shown in FIG. 2 and FIG. 3, the shielding structure further includes an auxiliary shielding structure configured to assist the strip-shaped section in blocking the electromagnetic waves. The auxiliary shielding structure includes, for example, an auxiliary shielding via 24 which penetrates through the circuit board 1 in the direction perpendicular to the circuit board 1. The auxiliary shielding via 24 is located on an outer side of the region where the strip-shaped section is located, i.e., a side of the strip-shaped sections away from the connection terminals of the signal lines 3. A conductive layer is disposed in the auxiliary shielding via 24 and is grounded, and is configured to block the electromagnetic waves leaked through the gap between the strip-shaped sections and guide the electromagnetic waves into the ground layer of the circuit board 1, so that the signal waves may return to a signal hole through the ground plane, thereby reducing the return loss, and preventing the interference waves from entering the region where the strip-shaped sections is located through the gap.

As shown in FIG. 3, at least one auxiliary shielding via 24 is provided at a position corresponding to part (not all) of the gaps. In some embodiments, as shown in FIG. 2, at least one auxiliary shielding via 24 is provided at a position corresponding to each gap, so that the signal waves and the external interference waves which are leaked through all the gaps can be blocked. It should be noted that the present embodiment is not limited to the embodiments illustrated by FIG. 2 in which one auxiliary shielding via 24 is provided at the position corresponding to each of the two gaps. Specifically, a quantity of the gaps is not limited to two, a quantity of the auxiliary shielding vias 24 provided at the position corresponding to each gap may be two or more, and quantities of the auxiliary shielding vias 24 corresponding to different gaps may be the same or different.

The auxiliary shielding vias 24 in the present embodiment are not limited to the circular holes shown in FIGS. 2 to 4. In some embodiments, the auxiliary shielding via 24 may be a via having a cross-section in a shape of a bar, a rectangle, or an ellipse.

It should be noted that each of FIGS. 1 to 3 illustrate the embodiments in which the shielding structure including the plurality of strip-shaped sections is used to shield the two signal lines 3 from the electromagnetic waves, but the present embodiment is not limited thereto. In some embodiments, as shown in FIG. 4, the shielding structure including the plurality of strip-shaped sections may be used to shield one signal line 3 from the electromagnetic waves, or the shielding structure including the plurality of strip-shaped sections may be used to shield more than two signal lines 3 from the electromagnetic waves.

The shielding structure provided by the present embodiment includes the at least one strip-shaped section disposed in the peripheral area of the connection terminal of the signal line and configured to block the electromagnetic waves with the preset wavelength; since the strip-shaped section is in the shape of a strip, the limitations of the characteristics of the materials and the manufacturing processes of the circuit board can be overcome when the strip-shaped section is manufactured, and the gaps existing in the shielding structure can be reduced as much as possible. Thus, when the connection terminal of the signal line is connected to the connector and performs signal transmission with the connector, the shielding structure can effectively block the electromagnetic waves (e.g., the signal waves) generated by the signal transmission, so that the return loss during the signal transmission can be reduced. The shielding structure can also block the electromagnetic waves (e.g., the interference waves radiated from the outside) with the preset wavelength generated outside the region where the shielding structure is located, so as to effectively prevent the interference waves radiated from the outside from entering the region where the strip-shaped section is located, thereby preventing the interference waves from interfering with the electrical signals transmitted between the connection terminal and the connector, and ensuring the stability of the signal transmission between the connection terminal and the connector.

Figure 8:
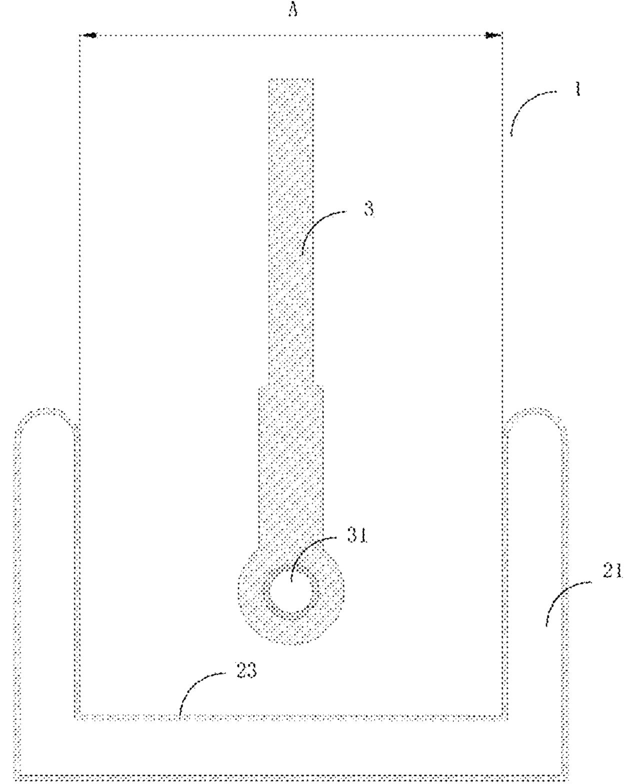
FIG. 8 is a structural diagram of a shielding structure of a circuit board according to an embodiment of the present disclosure.

FIG. 8 is a structural diagram of a shielding structure for a circuit board according to an embodiment of the present disclosure.

As shown in FIG. 8, the present embodiment provides a shielding structure, including one strip-shaped section which is disposed in the peripheral area of the connection terminal of the signal line 3 to form an "integrated" shielding structure, and the shielding structure is not provided with any slit or gap in the propagation direction of the signal waves radiated outwards from the connection terminal of the signal line 3, so that the signal waves can be blocked to the greatest extent. The outlet A for allowing the signal line 3 to be led out is formed between two ends of the strip-shaped section, so that the line bodies of all signal lines 3 that are located in the space where the strip-shaped section is located can be led out through the outlet A.

In some embodiments, as shown in FIG. 8, the strip-shaped section includes a first shielding via 21. Specifically, the first shielding via 21 is a via which penetrates through the circuit board 1 in the direction perpendicular to the circuit board 1. The conductive layer 23 is provided on a hole wall of the first shielding via 21 and is grounded. Since the strip-shaped section is not provided with any slit or gap, the conductive layer 23 disposed on the hole wall of the first shielding via 21 can guide the signal waves radiated outwards from the connection terminal of the signal line 3 into the ground plane of the circuit board 1 to the greatest extent, and the signal waves can be then transmitted to the connection terminal of the signal line 3 through the ground plane, so that the return of the signal waves is completed, which can effectively reduce the return loss.

In some embodiments, as shown in FIG. 8, a shape of a cross section of the first shielding via 21 parallel to the circuit board 1 is, for example, approximately a shape of "U". Apparently, in practical applications, the shape of the cross section of the first shielding via 21 parallel to the circuit board 1 may also be any other shape, for example, the shape of the cross section of the first shielding via 21 parallel to the circuit board 1 may be, for example, approximately a shape of "L", or an arc shape.

Optionally, in some embodiments, the conductive layer 23 in the first shielding via 21 may cover the entire inner wall of the first shielding via 21, or may cover part of the inner wall of the first shielding via 21. For example, the conductive layer 23 in the first shielding via 21 covers a portion of the inner wall on a side close to the connection terminal of the signal line 3 or covers a portion of the inner wall on a side away from the connection terminal of the signal line 3.

It should be noted that FIG. 8 illustrates the embodiments in which the shielding structure including the one strip-shaped section is used to shield the one signal line 3 from the electromagnetic waves, but the present embodiment is not limited thereto. In some embodiments, the shielding structure including the one strip-shaped section may be used to shield two or more signal lines 3 from the electromagnetic waves. In the case where the shielding structure shields two or more signal lines 3 from the electromagnetic waves, the present embodiment can be further combined with the above embodiments, for example, in some embodiments, the shielding structure includes the one strip-shaped section disposed in peripheral areas of connection terminals of the plurality of signal lines, and the strip-shaped sections correspondingly disposed at intervals between the line bodies of the plurality of signal lines, thus forming the plurality of aforesaid outlets, so that the line bodies of the plurality of signal lines can be respectively led out through the corresponding outlets, thereby preventing the electromagnetic waves from being leaked through the intervals between the line bodies of the plurality of signal lines.

The shielding structure provided by the present embodiment includes the one strip-shaped section, which is disposed in the peripheral area of the connection terminal of the signal line to form the "integrated" shielding structure, so that no gap exists in the shielding structure. Thus, when the connection terminal of the signal line is connected to the connector and performs signal transmission with the connector, the shielding structure can to the greatest extent block the electromagnetic waves generated by the signal transmission, thereby reducing the return loss during the signal transmission. Moreover, the shielding structure can to the greatest extent block the electromagnetic waves generated outside the region where the shielding structure is located, thereby preventing the interference waves from interfering with the electrical signals transmitted between the connection terminal and the connector, and ensuring the stability of the signal transmission between the connection terminal and the connector.

The present disclosure further provides a circuit board. Specifically, as shown in FIG. 1, the circuit board 1 includes the at least one signal line 3 and the shielding structure. The signal line 3 is configured to be electrically connected to the connector. In some embodiments, the signal line 3 is located in a wiring layer of the circuit board 1; and the shielding structure is configured to block the electromagnetic waves, such as the signal waves radiated outwards from the connection terminal of the signal line 3 and the interference waves radiated from the outside, and the shielding structure disposed in the peripheral area(s) of the connection terminal (s) of one or more signal lines 3. The shielding structure is the shielding structure provided by any of the above embodiments, and includes the at least one strip-shaped section disposed in the peripheral area of the connection terminal. The quantity of the shielding structures may be one or more, so that the one shielding structure is used to shield the at least one signal line 3 from the electromagnetic waves, or the plurality of shielding structures are used to shield the plurality of signal lines 3 from the electromagnetic waves.

Figure 9:
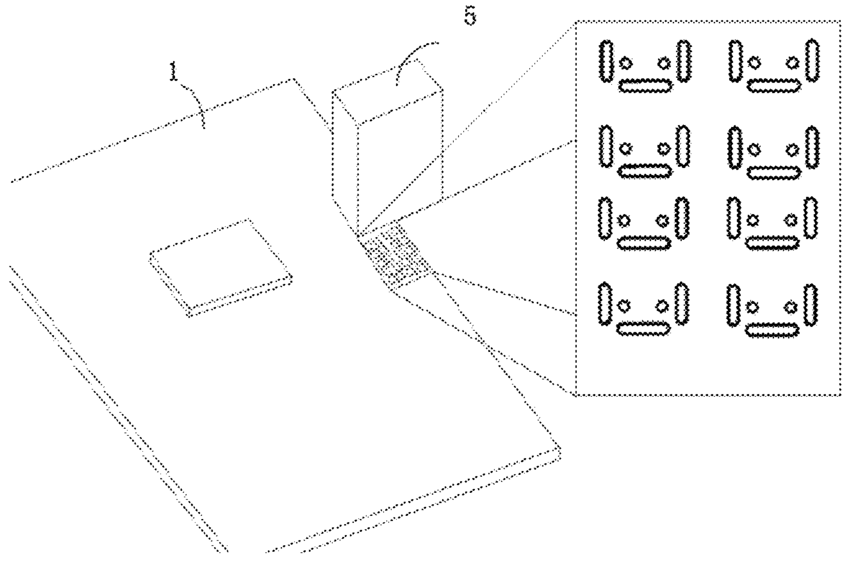
FIG. 9 is a simplified structural diagram of a circuit board connected to a connector according to an embodiment of the present disclosure.
Figure 10:
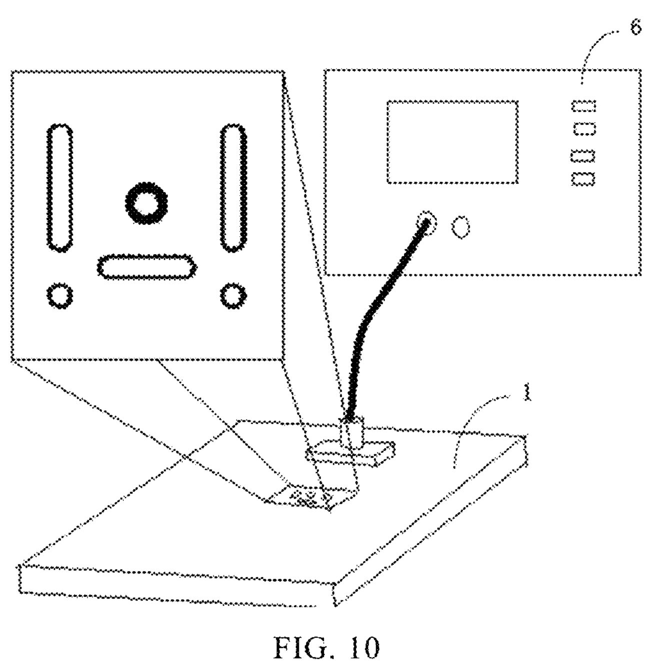
FIG. 10 is a simplified structural diagram of a circuit board connected to a test instrument according to an embodiment of the present disclosure.

FIG. 9 is a simplified structural diagram of a circuit board connected to a connector according to an embodiment of the present disclosure, and FIG. 10 is a simplified structural diagram of a circuit board connected to a test instrument according to an embodiment of the present disclosure.

As shown in FIG. 9, in some embodiments, the circuit board 1 may be used to be connected to a connector 5 for performing signal transmission with other devices. In some other embodiments, as shown in FIG. 10, the circuit board 1 may be used to be connected to a test instrument 6 for testing signal transmission capabilities such as a signal transmission rate and a bandwidth.

In some embodiments, the plurality of signal lines 3 are provided and are arranged parallel to each other at intervals. As shown in FIG. 1, for example, the quantity of the signal lines 3 is, for example, two, and the two signal lines 3 form differential signal lines. The peripheral areas of the connection terminals of the plurality of signal lines 3 are all disposed with the shielding structure. Since a plurality of pairs of differential signal lines are generally arranged parallel to each other in an existing PCB, a relatively large distance usually needs to be provided between different pairs of differential signal lines for avoiding signal interference between the different pairs of differential signal lines. Compared with that, the arrangement provided by the present embodiment that the peripheral areas of the connection terminals of the plurality of signal lines 3 are disposed with the shielding structure can avoid signal interference between the different pairs of differential signal lines 3, and allow for a smaller distance between the different pairs of differential signal lines 3, so that the circuit board 1 can have a more compact layout structure.

In some embodiments, no ground plane exists in the region where the shielding structure is located on a plane parallel to the circuit board 1. In some embodiments, the ground layer of the circuit board 1 is the ground network, and the region where the strip-shaped section is located on the plane parallel to the circuit board 1 corresponds to a position of a network hole of the ground network. Alternatively, in some other embodiments, the ground layer is provided with an outlet which corresponds to the position of the region where the strip-shaped section is located on the plane parallel to the circuit board 1, so that no ground plane exists in the region where the shielding structure is located. The reason for such arrangement is as follows: if the ground plane is provided in the region where the shielding structure is located, the return loss of the signal line during the signal transmission is strongly correlated with an anti-pad size of the ground plane in the peripheral area of the connection terminal of the signal line 3. When an overall design of the circuit board is carried out, sizes of all anti-pads in different stacked layers need to be adjusted accordingly because materials, thicknesses, and functions of the different stacked layers are different, and the adjustment processes need enormous simulation analysis and continuous iteration tests, resulting in a great increase in design cost. In the present disclosure, no ground plane exists in the peripheral area of the connection terminal of the signal line 3, which makes the return loss independent of the anti-pad size of the ground plane in the peripheral area of the connection terminal, so that the need to perform the simulation analysis and tests on the sizes of the anti-pads in the different stacked layers of the circuit board 1 is obviated, thereby saving a large amount of design cost.

Figure 11:
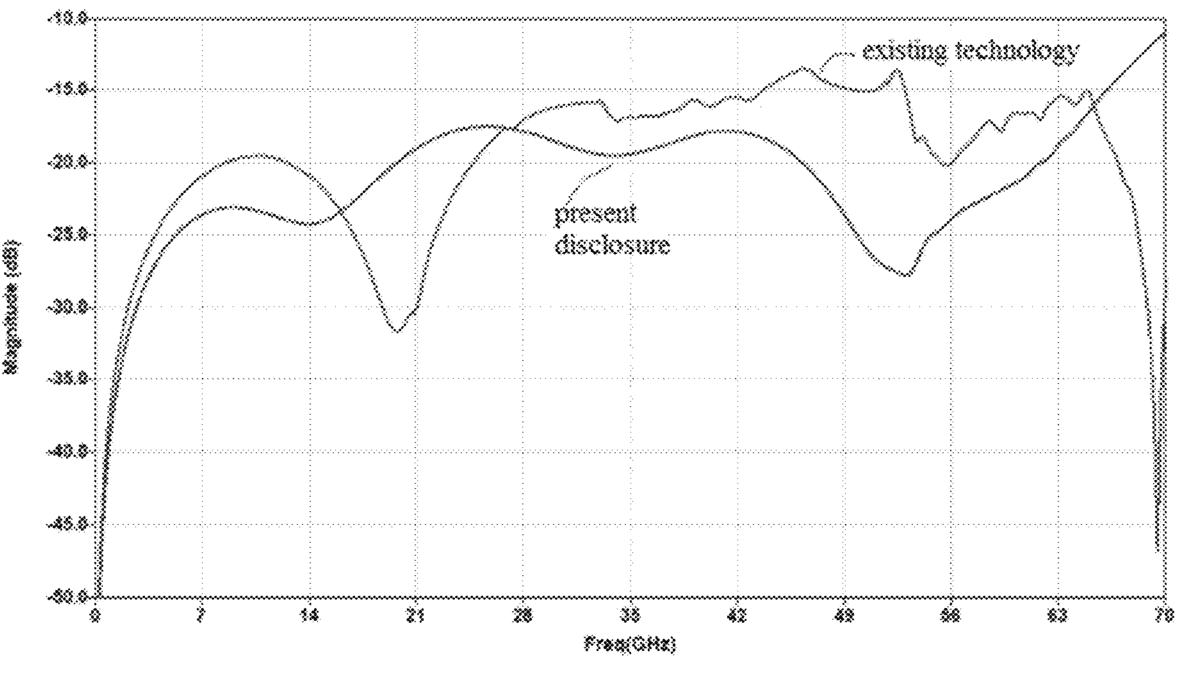
FIG. 11 is a curve graph of return losses of a circuit board according to an embodiment of the present disclosure and a circuit board according to the existing technology.

FIG. 11 is a curve graph of return losses of a circuit board according to an embodiment of the present disclosure and a circuit board according to the existing technology.

It can be seen from FIG. 11 that, compared with the existing circuit board, the return loss of the circuit board provided by the present embodiment is reduced by 5 dB to 10 dB. Furthermore, the circuit board in the existing technology can merely transmit high-frequency signals with a frequency of 45 GHz, while the circuit board provided by the present embodiment can transmit high-frequency signals within a frequency up to 67 GHz.

The circuit board provided by the present embodiment adopts the shielding structure provided by the above embodiments to block the electromagnetic waves, so as to block the signal waves radiated outwards and the interference waves radiated from the outside when the circuit board and the connector perform signal transmission, thereby reducing the return loss during the signal transmission and ensuring the stability of the signal transmission; and moreover, in the case where the circuit board includes the plurality of pairs of differential signal lines, adopting the shielding structure provided by the above embodiments to block the electromagnetic waves can avoid signal crosstalk between the different pairs of differential signal lines, and can also obviate the need to set a relatively large distance between the different pairs of differential signal lines, thereby making the layout structure of the circuit board more compact.

It should be understood that the above embodiments are merely exemplary embodiments adopted to illustrate the principle of the present disclosure, and the present disclosure is not limited thereto. Various modifications and improvements can be made by those of ordinary sill in the art without departing from the spirit and essence of the present disclosure, and those modifications and improvements are also considered to fall within the scope of the present disclosure.

What is claimed is:

1. A shielding structure of a circuit board for blocking electromagnetic waves, comprising:

at least one strip-shaped section disposed in a peripheral area of a connection terminal of a signal line in the circuit board and configured to block the electromagnetic waves with a preset wavelength, wherein the shielding structure is provided with an outlet for allowing the signal line to be led out, each of the at least one strip-shaped section comprises a shielding via penetrating through the circuit board in a direction perpendicular to the circuit board, and a conductive layer is disposed on a hole wall of the shielding via and is grounded.

2. The shielding structure of claim 1, wherein the at least one strip-shaped section comprises one strip-shaped section disposed in the peripheral area of the connection terminal of the signal line, and the outlet is formed between two ends of the one strip-shaped section.

3. The shielding structure of claim 1, wherein the at least one strip-shaped section comprises a plurality of strip-shaped sections, the outlet is formed between two adjacent strip-shaped sections of the plurality of strip-shaped sections, and a gap is provided between at least one pair of strip-shaped sections adjacent to each other among other strip-shaped sections except the two adjacent strip-shaped sections of the plurality of strip-shaped sections, and the gap meets a requirement of blocking the electromagnetic waves with the preset wavelength.

4. The shielding structure of claim 1, wherein the at least one strip-shaped section comprises a plurality of strip-shaped sections, the outlet is formed between two adjacent strip-shaped sections of the plurality of strip-shaped sections, and there is no gap provided between every two adjacent strip-shaped sections among other strip-shaped sections except the two adjacent strip-shaped sections of the plurality of strip-shaped sections.

5. The shielding structure of claim 3, wherein a quantity of the plurality of strip-shaped sections is three, a quantity of second shielding vias is three, the three second shielding vias are all strip-shaped holes, and two shielding vias, which are adjacent to the outlet, of the three second shielding vias are parallel to each other, and are perpendicular to a remaining one of the three second shielding vias.

6. The shielding structure of claim 3, wherein the shielding structure further comprises an auxiliary shielding structure configured to assist the plurality of strip-shaped sections in blocking the electromagnetic waves, the auxiliary shielding structure comprises an auxiliary shielding via penetrating through the circuit board in a direction perpendicular to the circuit board, the auxiliary shielding via is disposed on a side of the plurality of strip-shaped sections away from the connection terminal of the signal line, and a conductive layer is disposed in the auxiliary shielding via and is grounded.

7. The shielding structure of claim 6, wherein at least one the auxiliary shielding via is provided at a position corresponding to each gap.

8. A circuit board, comprising:

at least one signal line configured to be electrically connected to a connector; and a shielding structure, which is the shielding structure of claim 1.

9. The circuit board of claim 8, wherein a ground layer of the circuit board is a ground network, and a region where the at least one strip-shaped section is located on a plane parallel to the circuit board corresponds to a position of a network hole of the ground network.

10. The circuit board of claim 8, wherein a ground layer of the circuit board is provided with an outlet corresponding to a position of a region where the at least one strip-shaped section is located on a plane parallel to the circuit board.

11. The shielding structure of claim 4, wherein each of the plurality of strip-shaped sections comprises a second shielding via penetrating through the circuit board in a direction perpendicular to the circuit board, and a conductive layer is disposed on an inner wall of the second shielding via and is grounded.

12. The shielding structure of claim 11, wherein a quantity of the plurality of strip-shaped sections is three, a quantity of second shielding vias is three, the three second shielding vias are all strip-shaped holes, and two shielding vias, which are adjacent to the outlet, of the three second shielding vias are parallel to each other, and are perpendicular to a remaining one of the three second shielding vias.

* * * * *